(12) United States Patent
Ozgun et al.

(10) Patent No.: US 8,384,457 B2
(45) Date of Patent: Feb. 26, 2013

(54) DUTY CYCLE CORRECTION

(75) Inventors: Mehmet T. Ozgun, Dallas, TX (US);
Chi Zhang, Dallas, TX (US); See Taur Lee, Allen, TX (US)

(73) Assignee: Icera Inc., Wilmington, DE (US)

( * ) Notice: Subject to any disclaimer, the term of this patent is extended or adjusted under 35 U.S.C. 154(b) by 91 days.

(21) Appl. No.: 13/081,315

(22) Filed: Apr. 6, 2011

(65) Prior Publication Data

US 2012/0256669 A1   Oct. 11, 2012

(51) Int. Cl.
*H03K 3/017* (2006.01)
*H03K 5/04* (2006.01)
*H03K 7/08* (2006.01)

(52) U.S. Cl. .................. 327/175; 327/176; 327/177

(58) Field of Classification Search .............. 327/175, 327/176, 177
See application file for complete search history.

(56) References Cited

U.S. PATENT DOCUMENTS

| | | | |
|---|---|---|---|
| 4,479,216 A | 10/1984 | Krambeck et al. | |
| 5,057,702 A * | 10/1991 | Kitagawa et al. | 327/175 |
| 5,907,254 A | 5/1999 | Chang | |
| 6,670,838 B1 | 12/2003 | Cao | |
| 7,423,467 B1 | 9/2008 | Simon | |
| 7,683,683 B1 | 3/2010 | Majumder et al. | |
| 7,705,647 B2 | 4/2010 | Dai et al. | |
| 7,724,049 B2 | 5/2010 | Lin et al. | |
| 7,791,388 B2 | 9/2010 | Gomm | |
| 7,839,192 B1 | 11/2010 | Wang | |
| 7,839,195 B1 | 11/2010 | Feng et al. | |
| 2002/0070752 A1 | 6/2002 | Harrison | |
| 2003/0112046 A1 | 6/2003 | Atallah et al. | |
| 2004/0174196 A1 | 9/2004 | Hochschild et al. | |
| 2009/0072873 A1 | 3/2009 | Denier | |

* cited by examiner

*Primary Examiner* — John Poos

(57) ABSTRACT

Method and circuitry for controlling duty cycle of an input signal towards a desired value comprising a sequence of at least two inverters arranged in series and feedback circuitry. A first inverter is arranged to receive the input signal and a last inverter is arranged to output a signal having the same frequency as the input signal. The output signal is an adjusted version of the input signal. The feedback circuitry is arranged to receive the output signal and comprises a comparing and supplying means. The comparing means compares the output signal with a reference signal indicative of a desired value and generates a feedback signal based on the comparison of the output and reference signal. The supplying means supplies the feedback signal to adjust operating conditions of at least one of the inverters, such that the duty cycle of the output signal is controlled towards the desired value.

20 Claims, 11 Drawing Sheets

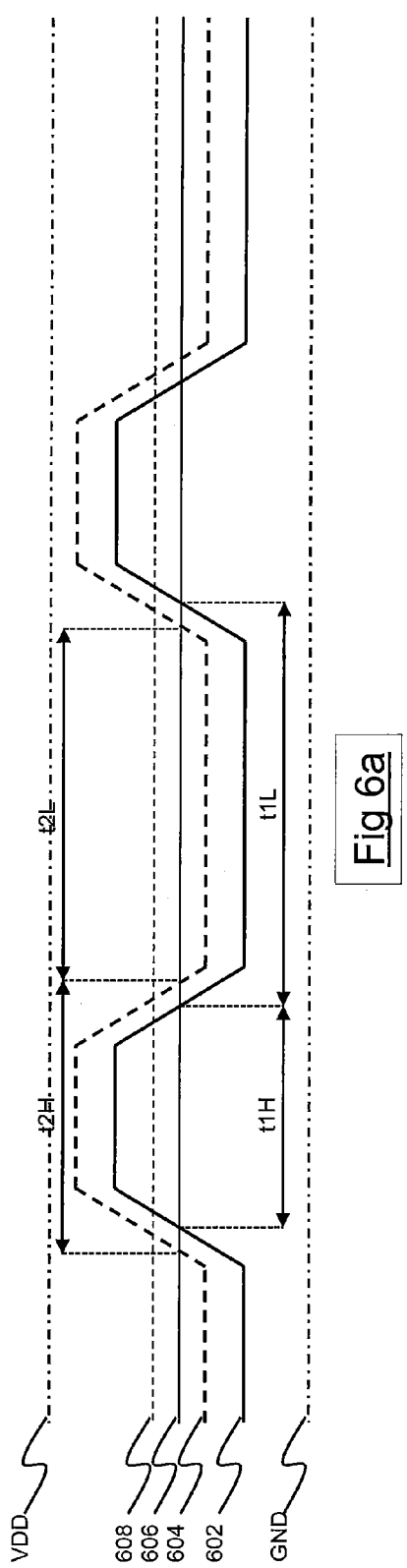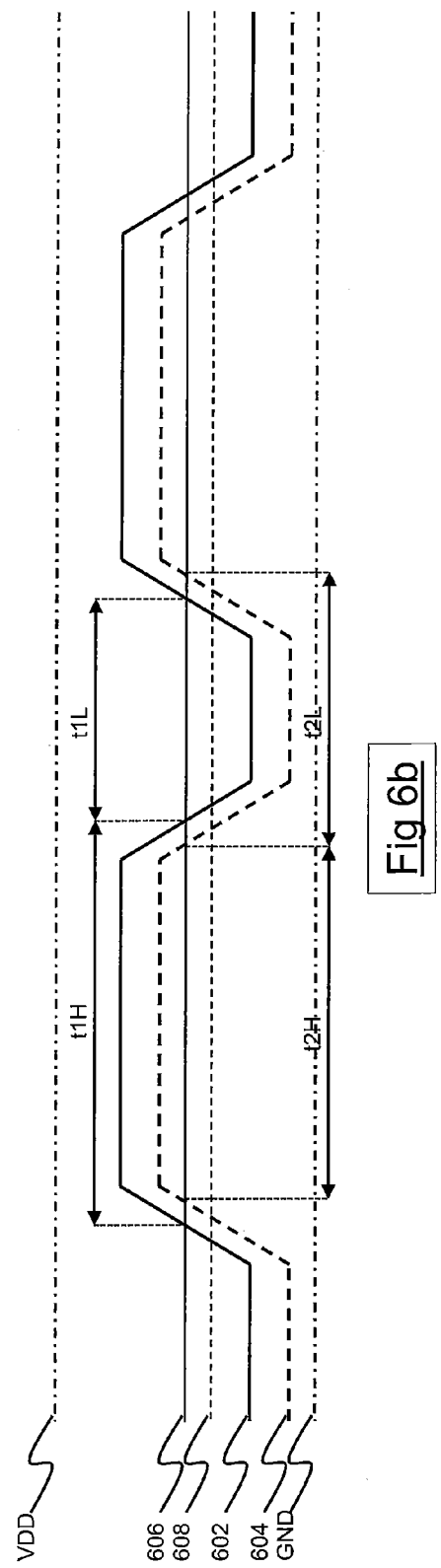

DUTY CYCLE CORRECTION

FIELD OF THE INVENTION

The present invention relates to duty cycle correction. In particular, the present invention relates to controlling the duty cycle of a signal towards a desired value.

BACKGROUND

Oscillating signals are used in many electronic systems, for many different purposes. For example, an oscillating signal may be used as a clock signal in an electronic system for timing actions of the system correctly (e.g., to synchronize operations of the system). Oscillating signals may be used for other purposes also. In digital circuits, an oscillating clock signal transitions between a high level and a low level and at least some of the transitions occur at regular intervals to provide a regular clock signal. The oscillating signal has a duty cycle which is given by the proportion of time for which the signal has a high value. For example, a clock signal has a duty cycle of 50% when for half of the clock period the clock signal has a high value and for the other half of the clock period the clock signal has a low value. If a clock signal has a duty cycle of more than 50% then the clock signal is high for more than half of the clock period, and the clock signal is low for less than half of the clock period. In contrast, if a clock signal has a duty cycle of less than 50% then the clock signal is high for less than half of the clock period, and the clock signal is low for more than half of the clock period.

It is often desirable to have a clock signal which has a duty cycle of 50%. With a duty cycle of 50%, each transition on the clock signal occurs at a regular time interval following the previous transition. This allows a circuit which is driven by the clock signal to use both the rising and falling edges of the clock signal to trigger synchronous circuits to achieve a faster operating speed.

A local oscillator may generate an oscillating signal for use in an electronic system. For a number of reasons, the signal generated by the local oscillator may not have a duty cycle of 50%. For example, mismatches in components of the local oscillator may result in the duty cycle of the oscillating signal being different from 50%. Therefore, a duty cycle correction circuit may be used to adjust the duty cycle of the signal generated by the local oscillator before the oscillating signal is used in the rest of the electronic system.

The circuit 100 shown in FIG. 1 acts as a buffer to provide a rail-to-rail Local Oscillator (LO) signal, e.g., to mixers. Generally, LO circuitry can be far away from the mixers on a chip, which can cause attenuation in the LO signal provided to the mixers. The circuit 100 also provides some inherent duty cycle correction, as described below. The circuit 100 comprises an input line 102 for receiving an input signal from a local oscillator (LO-IN) and an output line 104 for outputting an adjusted signal (LO-OUT). The output signal has the same frequency as the input signal, but the duty cycle of the output signal may be adjusted relative to the input signal. The circuit 100 also comprises an AC coupling capacitor 106, a first inverter 108, a second inverter 110, and a resistor 112. The input line 102 is coupled to an input of the AC coupling capacitor 106. An output of the AC coupling capacitor 106 is coupled to a data input of the first inverter 108. An output of the first inverter 108 is coupled to a data input of the second inverter 110. An output of the second inverter 110 is coupled to the output line 104. The output of the first inverter 108 is coupled to the data input of the first inverter 108 via the resistor 112. The first and second inverters 108 and 110 are connected to a supply voltage and to a ground voltage. The ground voltage is also coupled to the output line 104 via a coupling capacitor as shown in FIG. 1.

In operation an input signal is received from the local oscillator on the input line 102 and passed to the AC coupling capacitor 106. The AC coupling capacitor 106 allows the AC components of the input signal to pass through to the rest of the circuit 100, but the DC components of the input signal are blocked. In this way the DC bias of the input signal is isolated from the rest of the circuit 100. The input signal then passes from the AC coupling capacitor 106 to the data input of the first inverter 108. The output of the first inverter 108 is the inverse of the data input to the first inverter 108. Therefore, when the value of the input signal at the data input of the first inverter 108 is high, then the value of the output of the first inverter 108 is low. Likewise, when the value of the input signal at the data input of the first inverter 108 is low, then the value of the output of the first inverter 108 is high. The output of the first inverter 108 is fed back to the input of the first inverter 108 via the resistor 112. The result of this resistor feedback is explained in more detail below with reference to FIGS. 3a and 3b. The signal passes from the first inverter 108 to the second inverter 110, where the signal is inverted once again and passed to the output line 104. Therefore, the output signal on the output line 104 has the same frequency as the input signal on the input line 102 and has the same polarity (i.e., there is an even number of inverters—in this case two).

FIG. 2 shows a circuit diagram of a CMOS inverter 200 which may be used for the inverters 108 and 110 in the circuit 100. It would be apparent to a person skilled in the art that the first and second inverters 108 and 110 could be implemented as any other suitable type of inverter instead of as a CMOS inverter. The CMOS inverter 200 includes a supply line 202 connected to a supply voltage, a ground line 204 connected to a ground voltage, a data input line 206 for receiving an input signal, an output line 208 for outputting an output signal, a PMOS transistor 210, and an NMOS transistor 212. The input signal is received on data input line 206 and passed to the gate of the PMOS transistor 210 and is also passed to the gate of the NMOS transistor 212. The drains of both the PMOS transistor 210 and the NMOS transistor 212 are connected to the output line 208. The supply line 202 supplies a positive voltage (Vdd) to the source terminal of the PMOS transistor 210. The ground line 204 supplies a ground voltage (Gnd) to the source terminal of the NMOS transistor 212. When the input signal is high, current flows through the NMOS transistor 212 but not through the PMOS transistor 210, such that the output signal on output line 208 is brought to a low value. When the input signal is low, current flows through the PMOS transistor 210 but not through the NMOS transistor 212, such that the output signal on output line 208 is brought to a high value.

The circuit 100 provides some duty cycle correction of the input signal as described with reference to FIGS. 3a and 3b. FIGS. 3a and 3b show the value (i.e., the voltage level) of the signal as a function of time. The supply voltage VDD is shown at a high level and the ground voltage GND is shown at a low level. The supply voltage (VDD) and ground voltage (GND) are supplied to the inverters 108 and 110. The line 302 shows the value of the input signal arriving on input line 102 prior to reaching the AC coupling capacitor 106. The line 304 shows the value of the input signal once it has passed through the AC coupling capacitor 106. As described above, the AC coupling capacitor isolates the DC bias of the input signal from the rest of the circuit 100, and this is why the DC value of the input signal can change after the AC coupling capacitor 106, but the AC components of the input signal do not significantly change due to the AC coupling capacitor 106. The line 306 shows the switching point of the second inverter 110. The switching point is the voltage level at which the second inverter 110 has a transition between recognizing the input signal as having a high value and recognizing the input signal as having a low value. It can be appreciated from FIGS. 3a and 3b that the switching point of the second inverter 110 is chosen as half of the supply voltage, VDD. The line 308 shows the switching point of the first inverter 108 (i.e., the DC voltages at the input and output of the first inverter 108) due to the resistive feedback through the resistor 112. For simplification, the graphs shown in FIGS. 3a and 3b have assumed zero attenuation of the input signal (e.g., zero input capacitance) through the AC coupling capacitor 106.

FIG. 3a shows an imperfect input signal (as line 302) received at the signal chain shown in FIG. 1 from a local oscillator. The input signal is imperfect in the sense that the duty cycle of the input signal is less than 50%. This can be seen in FIG. 3a in that t1H (the duration for which the input signal 302 is at logic High) is less than t1L (the duration for which the input signal 302 is at logic Low). The DC operating point after the AC coupling capacitor 106 (as shown by line 308) is set by the resistive feedback through the resistor 112 and the AC coupling capacitor 106. Since t1H is lower than t1L, the on-time for the PMOS transistor 210 of the first inverter 108 is longer than the on-time of the NMOS transistor 212. Therefore, the output of the first inverter 108 has a high value for a longer duration than it has a low value. Due to the feedback through the resistor 112, this shifts the whole waveform of the input signal at the input of the first inverter 108, shown by line 304, up (relative to line 302), as shown in FIG. 3a. In other words, the DC operating point or switching point of the input signal at the first inverter 108 is increased (as shown by line 308). Meanwhile, the switching point of the second inverter 110 does not change as shown with line 306. It can be seen from FIG. 3a that the output signal has a high value for a time period t2H and the output signal has a low value for a time period t2L. It can also be seen that in the situation shown in FIG. 3a the duty cycle of the output signal is higher than the duty cycle of the input signal. In other words, when the duty cycle of the input signal is less than 50%, the duty cycle of the output signal is greater than the duty cycle of the input signal, i.e.

$$\frac{t2H}{t2L} > \frac{t1H}{t1L}.$$

FIG. 3b shows an imperfect input signal (as line 302) received at the signal chain shown in FIG. 1 from the local oscillator. The input signal is imperfect in the sense that the duty cycle of the input signal is more than 50%. This can be seen in FIG. 3b in that t1H (the duration for which the input signal 302 is at logic High) is more than t1L (the duration for which the input signal 302 is at logic Low). The DC operating point after the AC coupling capacitor 106 (as shown by line 308) is set by the resistive feedback through the resistor 112 and the AC coupling capacitor 106. Since t1H is greater than t1L, the on-time for the PMOS transistor 210 of the first inverter 108 is shorter than the on-time of the NMOS transistor 212. Therefore, the output of the first inverter 108 has a high value for a shorter duration than it has a low value. Due to the feedback through the resistor 112, this shifts the whole waveform of the input signal at the input of the first inverter 108, shown by line 304, down (relative to line 302), as shown in FIG. 3b. In other words, the DC operating point or switching point of the input signal at the first inverter 108 is decreased (as shown by line 308). Meanwhile, the switching point of the second inverter 110 does not change as shown with line 306. It can be seen from FIG. 3b that the output signal has a high value for a time period t2H and the output signal has a low value for a time period t2L. It can also be seen that in the situation shown in FIG. 3b the duty cycle of the output signal is lower than the duty cycle of the input signal. In other words, when the duty cycle of the input signal is more than 50%, the duty cycle of the output signal is less than the duty cycle of the input signal, $$\text{i.e.} \frac{t2H}{t2L} < \frac{t1H}{t1L}.$$

It can therefore be seen that the circuit 100 has some inherent duty cycle correction due to the AC coupling capacitor 106 and the duty cycle dependent DC operating voltage at the input of the first inverter 108 (provided by the resistor feedback). However, the inherent correction of circuit 100 is not always sufficient to correct the whole duty cycle mismatch. This can be seen in FIGS. 3a and 3b in that although the duty cycle has improved (relative to the input signal), the duty cycle of the output signal is still not equal to 50% in the examples shown in FIGS. 3a and 3b. Furthermore, the circuit 100 is inflexible in the sense that it only adjusts the duty cycle of the input signal towards 50%. Therefore if a duty cycle other than 50% is desired for the input signal then the circuit 100 may not be suitable for adjusting the duty cycle of the input signal to the desired duty cycle.

SUMMARY

According to a first aspect there is provided an embodiment of circuitry for controlling the duty cycle of an input signal towards a desired value, the circuitry comprising a sequence of at least two inverters arranged in series and feedback circuitry. A first inverter of the sequence of inverters is arranged to receive the input signal and a last inverter of the sequence of inverters is arranged to output an output signal having the same frequency as the input signal. The output signal is an adjusted version of the input signal. The feedback circuitry is arranged to receive the output signal. The feedback circuitry comprises a comparing means and a supplying means. The comparing means compares the output signal with a reference signal indicative of a desired value and generates a feedback signal based on the comparison of the output signal and the reference signal. The supplying means supplies the feedback signal to adjust operating conditions of at least one of the inverters of the sequence of inverters, such that the duty cycle of the output signal is controlled towards the desired value.

According to a second aspect there is provided a method of controlling the duty cycle of an input signal towards a desired value. The method comprises receiving the input signal, outputting an output signal, receiving the output signal at feedback circuitry, comparing the output signal with a reference signal, and supplying the feedback signal. The input signal is received at a first inverter of a sequence of at least two inverters arranged in series. The output signal has a same frequency as the input signal from a last inverter of the sequence of inverters. The output signal is an adjusted version of the input signal. The reference signal is indicative of a desired value at the feedback circuitry. The feedback circuitry generates a feedback signal based on the comparison of the output signal and the reference signal. The feedback signal adjusts operating conditions of at least one of the inverters of the sequence of inverters such that the duty cycle of the output signal is controlled towards the desired value

BRIEF DESCRIPTION OF THE DRAWINGS

For a better understanding of the present invention and to show how the same may be put into effect, reference will now be made, by way of example, to the following drawings in which:

FIG. 6a shows the value of a signal in the circuit of FIG. 4 as a function of time in a first situation;

FIG. 6b shows the value of a signal in the circuit of FIG. 4 as a function of time in a second situation;

DETAILED DESCRIPTION OF PREFERRED EMBODIMENTS

Figure 1:
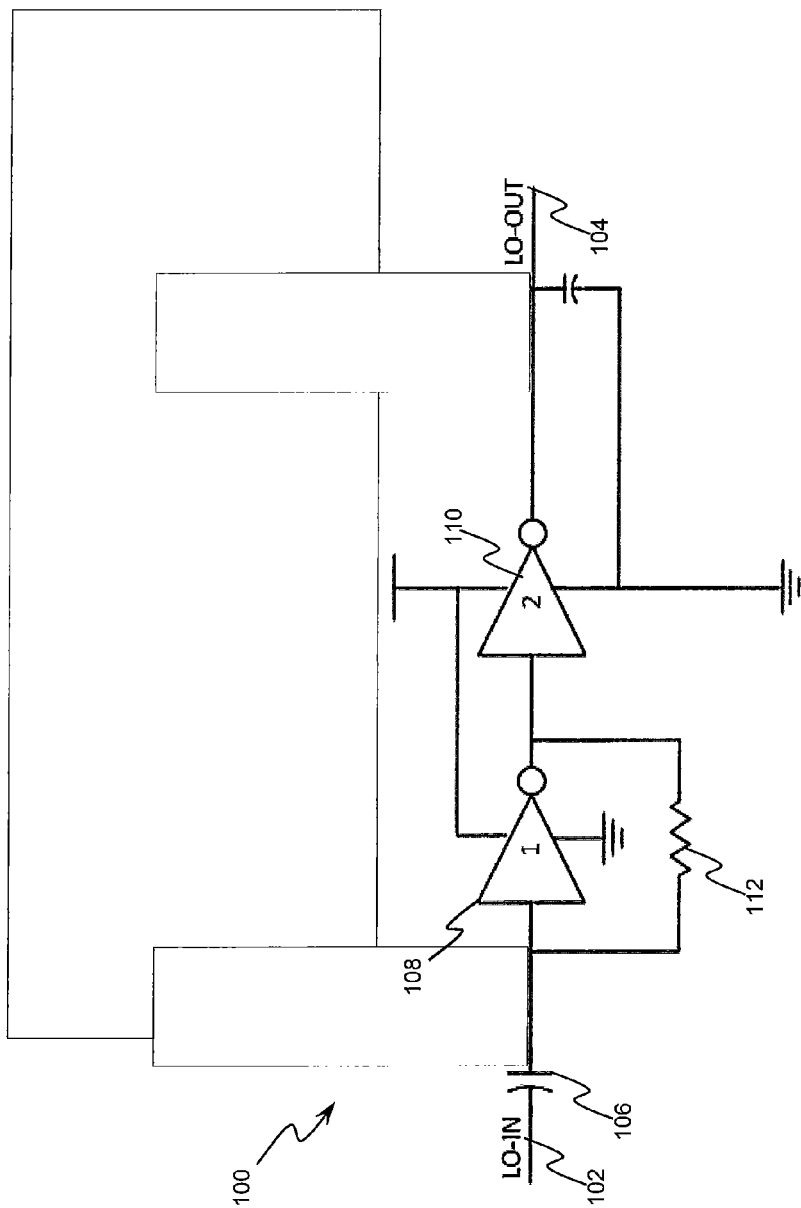
FIG. 1 is a circuit diagram of a prior art duty cycle correction circuit.
Figure 2:
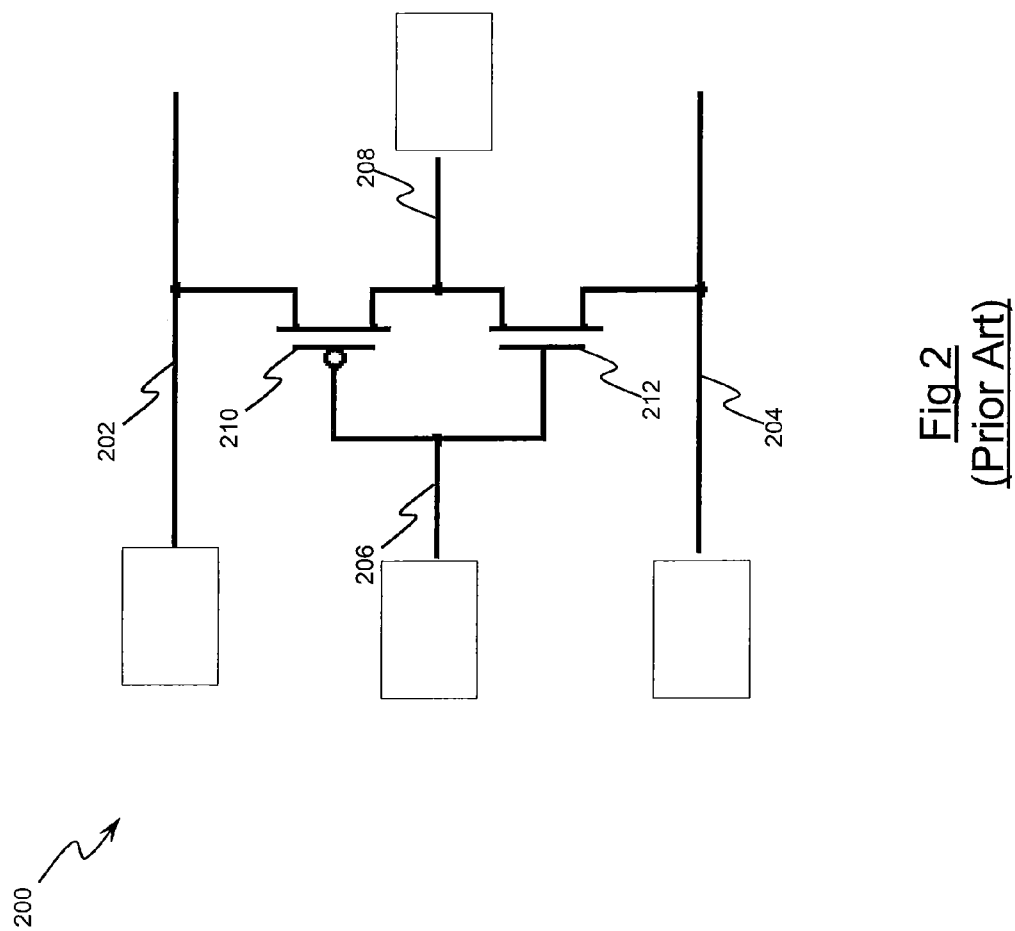
FIG. 2 shows a circuit diagram of a prior art CMOS inverter.

As discussed herein, since the feedback signal is generated based on the comparison of the output signal and the reference signal, the duty cycle may reliably be controlled towards a desired duty cycle. For example, in some embodiments, the feedback signal is generated based on the integral (over time) of the difference between the output signal and the reference signal. By changing the reference signal, the duty cycle of the output signal may be controlled towards different desired values (i.e., other than 50%). In this sense the circuitry may be programmable to control the duty cycle of the input signal towards different desired duty cycles. Furthermore, other embodiments of the invention may advantageously allow for greater adjustment of the duty cycle of an input signal towards a desired value than can be provided by the circuit 100 described above. This is achieved using the feedback circuitry. Being able to control the duty cycle of the input signal over a wide range of duty cycles is beneficial for many types of signal, e.g., clock signals. The circuitry of preferred embodiments allows the duty cycle of the signal to be accurately controlled. Furthermore, the circuitry of the preferred embodiments allows the signal to be generated with a less accurately defined duty cycle (which may be simpler to implement) because the circuitry can correct larger errors in the duty cycle.

Embodiments of the invention advantageously provide an automatic duty cycle correction loop to correct duty cycle mismatch of an input signal, such as a local oscillator signal. Correcting the duty cycle of the input signal can be useful in many different systems. For example, embodiments of the invention are implemented in Radio Frequency (RF) transmitters and/or RF receivers. In some embodiments, the signal may be implemented in architecture that uses an IQ (that is, "In-phase" and "Quadrature-phase") signal pair, and in these embodiments, the IQ mismatch of the signal is reduced both on a receiver and a transmitter of the signal, due to the correction of the duty cycle. This reduces the requirements for backend IQ calibration at the receiver and at the transmitter.

Furthermore, the correction of the duty cycle can lead to a relaxing of the IIP2 (second-order intermodulation intercept point) requirements on an RF receiver receiving a signal. This can be particularly beneficial because the IIP2 requirement of an RF receiver is one of the major bottlenecks in the design of a receiver for signals in the zero to Intermediate Frequency (IF) range. Therefore, the circuitry described herein for controlling the duty cycle of a signal may be usefully implemented in a cellular transmitter, especially where IQ mismatch and IIP2 requirements are major performance measures.

Furthermore, some embodiments provide low cost, low power and low noise circuitry for controlling the duty cycle of an input signal. The low noise, low power duty cycle correction loop of these embodiments can be implemented at transmitters in order to correct the duty cycle variations of a signal generated by a local oscillator (LO).

The circuitry can also comprise a coupling capacitor wherein the first inverter of the sequence of inverters is arranged to receive the input signal via the coupling capacitor. The coupling capacitor allows the DC bias of the input signal to be isolated from the first inverter.

Furthermore, the circuitry may comprise switching means for either engaging or disengaging the feedback circuitry from the sequence of inverters. This allows the feedback circuitry to be switched in or out, e.g., in dependence upon a determination as to whether the feedback circuitry will have a desired effect upon the input signal. The supplying means may be arranged to supply the feedback signal to the at least one of the inverters to thereby adjust the DC value of the input signal received at the at least one of the inverters. Alternatively, the at least one of the inverters may be connected to a ground voltage terminal via a transistor and a resistor arranged in parallel, and the supplying means may be arranged to supply the feedback signal to the gate of the transistor, such that the feedback signal adjusts the resistance between said at least one of the inverters and the ground voltage terminal. Alternatively still, the supplying means may be arranged to supply the feedback signal to a source voltage input of said at least one of the inverters, such that the feedback signal adjusts the source voltage supplied to said at least one of the inverters. As another alternative, the comparing means may comprise control logic for generating the feedback signal, wherein the supplying means may be arranged to supply the feedback signal to said at least one of the inverters, and the feedback signal may comprise instructions for adjusting the properties of at least one transistor within said at least one of the inverters to thereby adjust the operating conditions of said at least one of the inverters.

Figure 4:
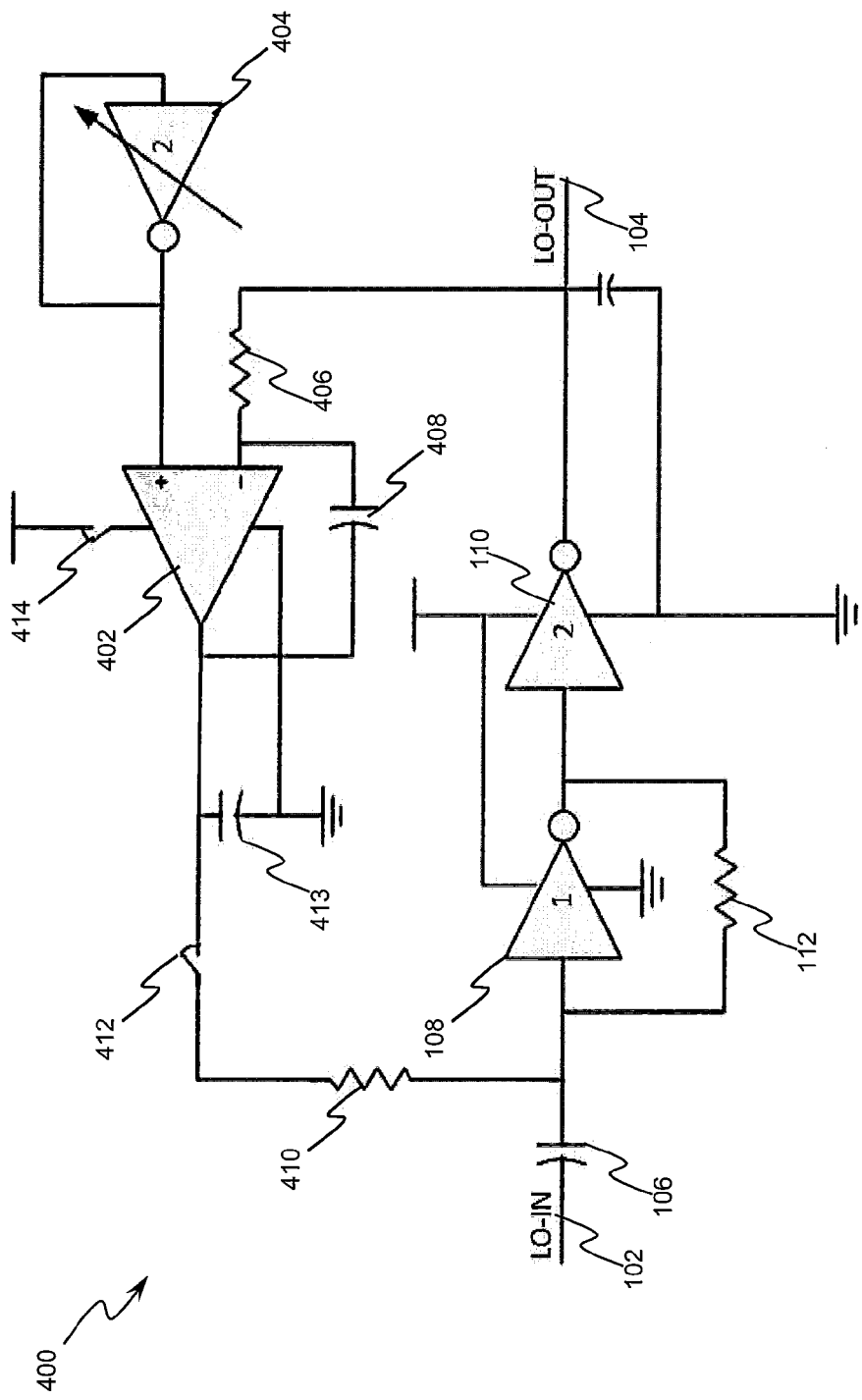
FIG. 4 is a circuit diagram of a duty cycle correction circuit according to an embodiment.

With reference to FIG. 4 there is described a circuit 400 for controlling the duty cycle of an input signal towards a desired value. Circuit 400 comprises the elements of circuit 100 described above, and corresponding reference numerals are provided in FIG. 4 to denote elements which correspond to those of circuit 100 described above. In particular, circuit 400 comprises the input line 102 for receiving an input signal, an output line 104 for outputting an output signal, the AC coupling capacitor 106, the first and second inverters 108 and 110, and the resistor 112 arranged in the same way as they are arranged in circuit 100 as described above.

Circuit 400 also comprises feedback circuitry which comprises an integrator 402, a reference signal generator 404, a second resistor 406, a second AC coupling capacitor 408, a third resistor 410, a first switch 412, and a second switch 414. The integrator 402 is arranged to receive the output signal at a negative data input from the output line 104 via the resistor 406. The integrator 402 is arranged to receive a reference signal at a positive data input from the reference signal generator 404. The integrator 402 is connected to a source voltage via the switch 414. The integrator 402 is connected to a ground voltage. The output of the integrator 402 is coupled to the input to the first inverter 108 via the switch 412 and the resistor 410. Capacitor 413 provides a shunt capacitive load which filters out the high frequencies in the feedback signal, thereby limiting the bandwidth of the integrator 402. The output of the integrator 402 is also coupled to the negative data input of the integrator 402 via the capacitor 408 to provide a capacitive feedback to the integrator 402. The capacitive feedback, along with the resistor 406, allows the integrator 402 to provide a suitable voltage integration process.

Figure 5:
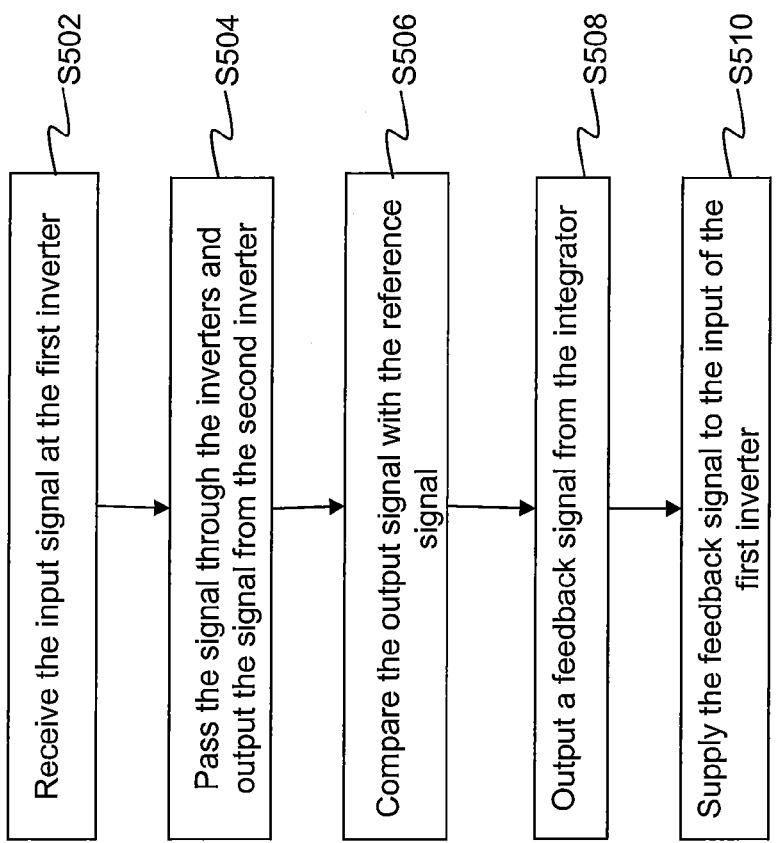
FIG. 5 is a flow chart for a process of controlling the duty cycle of an input signal according to an embodiment.

A method of operating the circuit 400 is described with reference to the flow chart of FIG. 5. In a step S502 the input signal is received at the first inverter 108 via the AC coupling capacitor 106. As described above in relation to circuit 100 the AC coupling capacitor 106 isolates the DC bias of the input signal from the rest of the circuit 400. This allows the DC operating point of the input to the first inverter 108 to be adjusted, independently of the DC bias on the input signal on line 102.

In a step S504 the signal passes through the inverters 108 and 110 and is output from the second inverter 110 to the output line 104, in the same way as described above in relation to circuit 100. The output signal is also passed from the second inverter 110 to the negative data input of the integrator 402 via the resistor 406.

The reference signal generator 404 generates a reference signal which is supplied to the positive data input of the integrator 402, such that in a step S506 the integrator 402 can compare the output signal with the reference signal. The reference signal is a DC signal. The reference signal generator 404 can vary the reference signal (as indicated by the arrow through the reference signal generator 404 shown in FIG. 4). As will be appreciated from the following description, the reference signal is indicative of the desired duty cycle towards which the duty cycle of the input signal is adjusted by the circuit 400. As an example, the reference signal generated by the reference signal generator 404 may be equal to the DC operating point of the second inverter 110 such that the duty cycle of the input signal is adjusted towards 50%.

The integrator 402 integrates the difference between the reference signal and the output signal at very low frequencies. In this sense, the integrator 402 integrates the difference between the reference signal and the output signal at a frequency range which is lower than the dominant frequency of the input signal. In this sense the integrator 402 integrates the area between the output signal and the reference signal. For example, if the input signal has exactly 50% duty cycle, the area between the output signal and the reference signal will add up to zero through a period (i.e., 50% hi, 50% low), which will set the switching point of the first inverter 108 to be equal to the reference signal.

In a step S508 a feedback signal is output from the integrator 402. In a step S510 the feedback signal is supplied from the integrator 402 to the data input of the first inverter 108 via the switch 412 and the resistor 410. The feedback signal is also coupled to the negative data input of the integrator 402 via the AC coupling capacitor 408. This feedback loop of the integrator 402 provides a negative feedback such that feedback signal output from the integrator 402 finds a stable value.

Figure 3A:
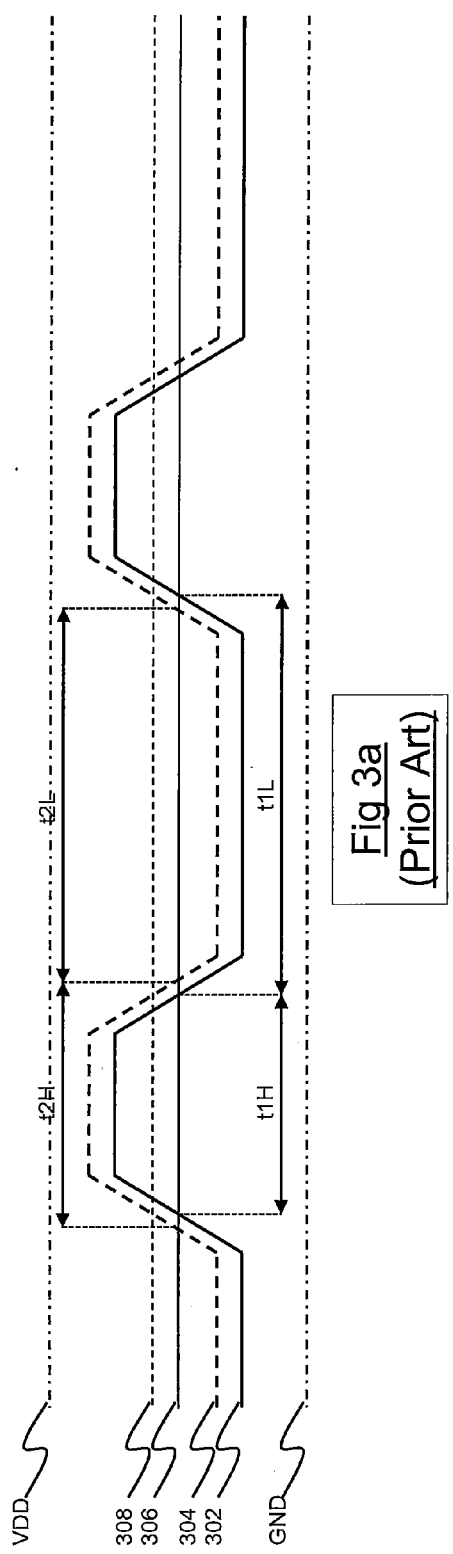
FIG. 3a shows the value of a signal in the circuit of FIG. 1 as a function of time in a first situation.
Figure 3B:
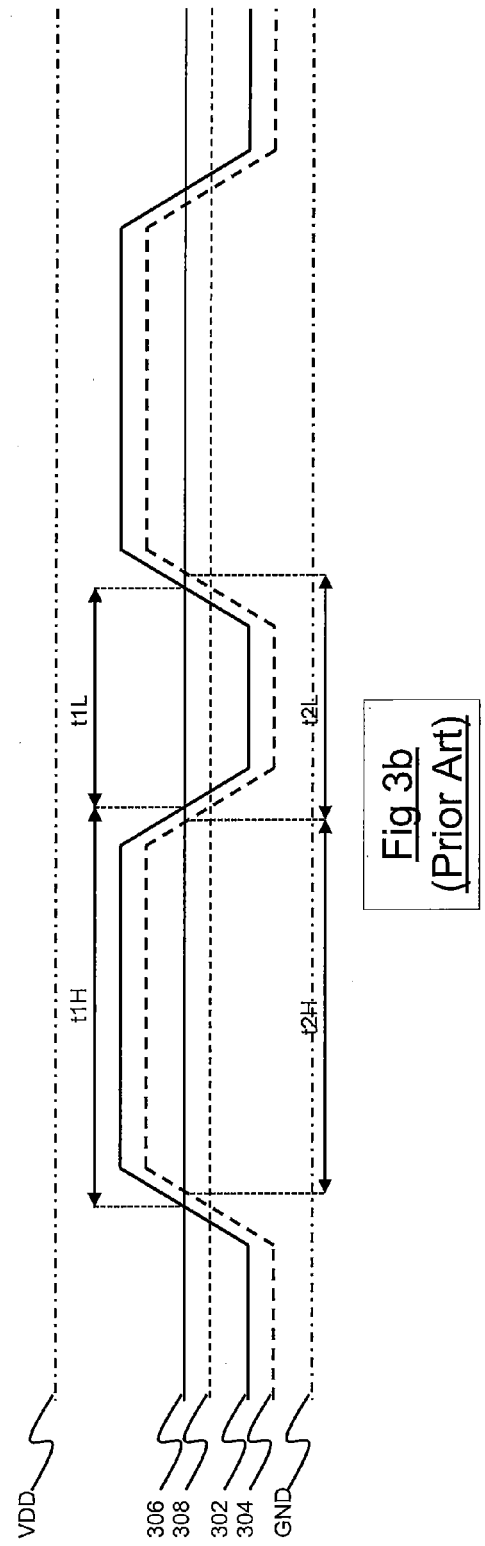
FIG. 3b shows the value of a signal in the circuit of FIG. 1 as a function of time in a second situation.

It will be appreciated that the feedback signal shifts the DC value of the input signal that is input to the data input of the first inverter 108. FIGS. 6a and 6b show the value (i.e., the voltage level) of the signal as a function of time in the circuit 400. It will be seen from the following description that FIGS. 6a and 6b are similar to FIGS. 3a and 3b which are described above in relation to the prior art. The supply voltage VDD is shown at a high level and the ground voltage GND is shown at a low level. The supply voltage (VDD) and ground voltage (GND) are supplied to the inverters 108 and 110. The line 602 shows the value of the input signal arriving on input line 102 prior to reaching the AC coupling capacitor 106. The line 604 shows the value of the input signal once it has passed through the AC coupling capacitor 106. As described above, the AC coupling capacitor isolates the DC bias of the input signal from the rest of the circuit 100, and this is why the DC value of the input signal can change after the AC coupling capacitor 106, but the AC components of the input signal do not significantly change due to the AC coupling capacitor 106. The line 606 shows the switching point of the second inverter 110. It can be appreciated from FIGS. 6a and 6b that the switching point of the second inverter 110 is chosen as half of the supply voltage, VDD. The line 608 shows the switching point of the first inverter 108 (i.e., the DC voltages at the input and output of the first inverter 108). For simplification, the graphs shown in FIGS. 6a and 6b have assumed zero attenuation of the input signal (e.g., zero input capacitance) through the AC coupling capacitor 106.

FIG. 6a shows an imperfect input signal (as line 602) received at the signal chain shown in FIG. 4 from the local oscillator. The input signal is imperfect in the sense that the duty cycle of the input signal is less than 50%. This can be seen in FIG. 6a in that t1H (the duration for which the input signal 602 is at logic High) is less than t1L (the duration for which the input signal 602 is at logic Low). The DC operating point after the AC coupling capacitor 106 (as shown by line 608) is affected by the resistive feedback through the resistor 112 and the AC coupling capacitor 106. Since t1H is lower than t1L, the on-time for the PMOS transistor 210 of the first inverter 108 is longer than the on-time of the NMOS transistor 212. Therefore, the output of the first inverter 108 has a high value for a longer duration than it has a low value. Due to the feedback through the resistor 112, this shifts the whole waveform of the input signal at the input of the first inverter 108, shown by line 604, up (relative to line 602). As well as the resistive feedback through the resistor 112, the circuit 400 has feedback through the feedback circuitry (i.e., from the integrator 402). If the output signal from the second inverter 110 is high for a shorter duration than it is low (i.e., if the duty cycle of the output signal is less than 50% as shown in FIG. 6a), then the total area shown in the graph of FIG. 6a between the output signal and the reference signal (which is set at the DC operating point of the second inverter 110) is negative. In other words, when the integrator 402 integrates the difference between the output signal (received at the negative data input of the integrator 402) and the reference signal (received at the positive data input of the integrator 402) over a time interval which is significantly longer than the time period of the output signal, the result will be positive. When the reference signal is set at the DC operating point of the second inverter 110 and the output signal has a duty cycle of less than 50% then the output of the integrator 402 will be positive. The integrator 402 integrates at very low frequencies as described above, which means that the output of the integrator 402 is substantially a DC feedback signal. This positive feedback signal is fed back to the data input of the first inverter 108 as shown in FIG. 4, thereby shifting up the DC value of the signal received at the input of the first inverter 108 (as shown by line 604 in FIG. 6a). The feedback signal will keep increasing the DC bias of the input signal received at the first inverter 108 until the total area between the output signal and the reference signal becomes zero. This may result in a much greater shift in the DC value of the input signal received at the first inverter 108 than can be achieved using the resistive feedback (through resistor 112) alone. The switching point of the second inverter 110 does not change as shown with line 606 in FIG. 6a. It can be seen that increasing the DC value of the input signal received at the first inverter 108 increases the duty cycle of the output signal. The output signal has a high value for a time period t2H and the output signal has a low value for a time period t2L, such that the duty cycle of the output signal is given by t2H/t2L). By comparing FIGS. 6a and 3a it can be seen that the feedback signal used in circuit 400 results in a greater adjustment (or correction) of the duty cycle of the input signal to bring the duty cycle towards 50%. In other words, the circuit 400 is more effective than the circuit 100 at controlling the duty cycle of the input signal.

FIG. 6b shows an imperfect input signal (as line 602) received at the signal chain shown in FIG. 4 from the local oscillator. The input signal is imperfect in the sense that the duty cycle of the input signal is more than 50%. This can be seen in FIG. 6b in that t1H (the duration for which the input signal 602 is at logic High) is more than t1L (the duration for which the input signal 602 is at logic Low). The DC operating point after the AC coupling capacitor 106 (as shown by line 608) is affected by the resistive feedback through the resistor 112 and the AC coupling capacitor 106. Since t1H is larger than t1L, the on-time for the PMOS transistor 210 of the first inverter 108 is shorter than the on-time of the NMOS transistor 212. Therefore, the output of the first inverter 108 has a high value for a shorter duration than it has a low value. Due to the feedback through the resistor 112, this shifts the whole waveform of the input signal at the input of the first inverter 108, shown by line 604, down (relative to line 602). As well as the resistive feedback through the resistor 112, the circuit 400 has feedback through the feedback circuitry (i.e., from the integrator 402). If the output signal from the second inverter 110 is high for a longer duration than it is low (i.e., if the duty cycle of the output signal is more than 50% as shown in FIG. 6b), then the total area shown in the graph of FIG. 6b between the output signal and the reference signal (which is set at the DC operating point of the second inverter 110) is positive. In other words, when the integrator 402 integrates the difference between the output signal (received at the negative data input of the integrator 402) and the reference signal (received at the positive data input of the integrator 402) over a time interval which is significantly longer than the time period of the output signal, the result will be negative. When the reference signal is set at the DC operating point of the second inverter 110 and the output signal has a duty cycle of more than 50% then the output of the integrator 402 will be negative. This negative feedback signal is fed back to the data input of the first inverter 108 as shown in FIG. 4, thereby shifting down the DC value of the signal received at the input of the first inverter 108 (as shown by line 604 in FIG. 6b). The feedback signal will keep decreasing the DC bias of the input signal received at the first inverter 108 until the total area between the output signal and the reference signal becomes zero. This may result in a much greater shift in the DC value of the input signal received at the first inverter 108 than can be achieved using the resistive feedback (through resistor 112) alone. It should be appreciated that the waveforms shown in FIGS. 3a, 3b, 6a and 6b are for explanatory purposes only and are not necessarily drawn to scale. The switching point of the second inverter 110 does not change as shown with line 606 in FIG. 6b. It can be seen that decreasing the DC value of the input signal received at the first inverter 108 decreases the duty cycle of the output signal. The output signal has a high value for a time period t2H and the output signal has a low value for a time period t2L, such that the duty cycle of the output signal is given by t2H/t2L). By comparing FIGS. 6b and 3b it can be seen that the feedback signal used in circuit 400 results in a greater adjustment (or correction) of the duty cycle of the input signal to bring the duty cycle towards 50%. In other words, the circuit 400 is more effective than the circuit 100 at controlling the duty cycle of the input signal.

As can be seen from FIGS. 6a and 6b, the duty cycle is affected by shifting the DC value of the input signal received at the first inverter 108 because the rising and falling times of the inverters 108 and 110 are finite (i.e., the slew rate of the rising and falling edges in the inverters 108 and 110 is not infinite). The slower the rising and falling times of the inverters are, the greater the effect that changing the DC value of the input signal to the first inverter 108 has on the duty cycle of the output signal. In other words, slower rising and falling edges of the inverters means that less change is required to the DC value of the input signal to the first inverter 108 to adjust the duty cycle of the input signal by a certain amount.

The reference signal generator 404 in the preferred embodiment described above is a re-sized replica of the second inverter 110 with unity feedback, such that the reference signal is equal to the DC operating point of the second inverter 110. However, the reference signal generator 404 is programmable such that the reference signal is variable. In this way the DC reference signal provided to the integrator 402 can be calibrated to different values, such that the duty cycle of the output signal may be controlled towards values other than 50%. This can be useful for testing purposes, e.g., to create intentional mismatch between operations in the system subsequent to the circuit 400 which use rising edges of the output signal compared to those that use falling edges of the output signal.

The circuit 400 includes switches 412 and 414. When the switches 412 and 414 are switched on then the feedback circuitry is engaged to supply the feedback signal to the first inverter 108 as described above. However, if the inherent correction provided by the resistive feedback (through resistor 112) is sufficient for overall system requirements, then the feedback circuitry can be disengaged by switching off the switches 412 and 414. In this way, when the resistive feedback is sufficient, power can be saved, and noise can be reduced, by switching off the feedback circuitry in the circuit 400. The input signal or the output signal can be monitored to determine whether or not, in the current conditions, it would be beneficial to use the feedback circuitry, e.g., by measuring the duty cycle of the input or output signal, and the switches 412 and 414 can be controlled in dependence upon the determination. For example, the feedback circuitry may only be used if the duty cycle of the input signal is within the range 30% to 70%, but the correction range may be dependent on many things such as frequency of operation, rising and falling time, power supply voltage, allowed noise degradation, etc.

Since the integrator 402 integrates only at very low frequencies as described above, the loop bandwidth of the feedback circuitry is very small. This means that the additional noise and current penalty associated with the feedback circuitry is minimal.

The values of the resistors and the capacitors in the circuit 400 are chosen to provide a stable feedback circuit (or feedback loop). The dominant pole of the circuit 400 can be either set through a big shunt capacitor or through the RC at the input of the first inverter 108, thereby stabilizing the feedback loop.

The feedback circuitry in the circuit 400 allows for a greater correction of the duty cycle of the input signal than can be provided by the circuit 100 through the resistive feedback (through resistor 112) alone. This can be seen by comparing FIGS. 3a and 3b with FIGS. 6a and 6b.

Figure 7:
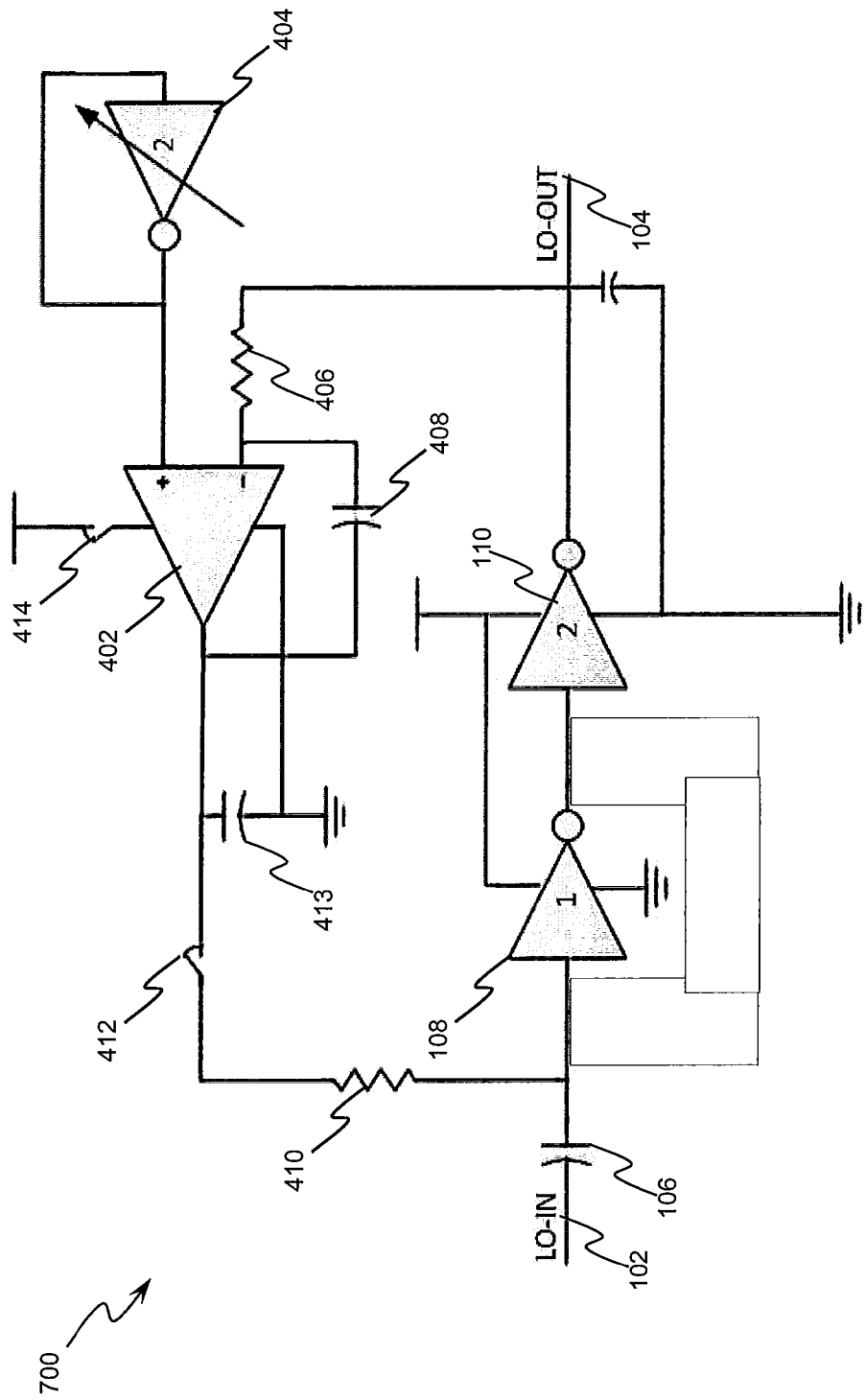
FIG. 7 is a circuit diagram of a duty cycle correction circuit according to a second embodiment.

FIG. 7 is a circuit diagram of a duty cycle correction circuit 700 according to a second embodiment. The circuit 700 is the same as the circuit 400 (and the elements in circuit 700 are denoted by the same reference numerals as the corresponding elements in circuit 400 described above) except circuit 700 does not include the resistive feedback provided by resistor 112 in circuit 400. Therefore in the circuit 700 shown in FIG. 7, all of the correction to the duty cycle of the input signal is provided by the feedback circuitry, as opposed to in the circuit 400 in which the correction to the duty cycle of the input signal is provided by the feedback circuitry and also by the resistive feedback through resistor 112. The circuit 700 is easier to stabilize than circuit 400. However, the circuit 700 has a smaller tuning range for adjusting the duty cycle of the input signal than can be provided by the circuit 400. This is because there is no resistive feedback in the circuit 700, so the duty cycle cannot be changed by as much as with the circuit 400. Furthermore, since there is no resistive feedback (i.e., no inherent correction of the duty cycle in circuit 700) if the feedback circuitry is switched off, by switching off the switches 412 and 414 then the circuit 700 provides no duty cycle correction. This is in contrast to the circuit 400 which, as described above, provides inherent duty cycle correction through the resistor 112 even when the switches 412 and 414 are switched off.

Figure 8:
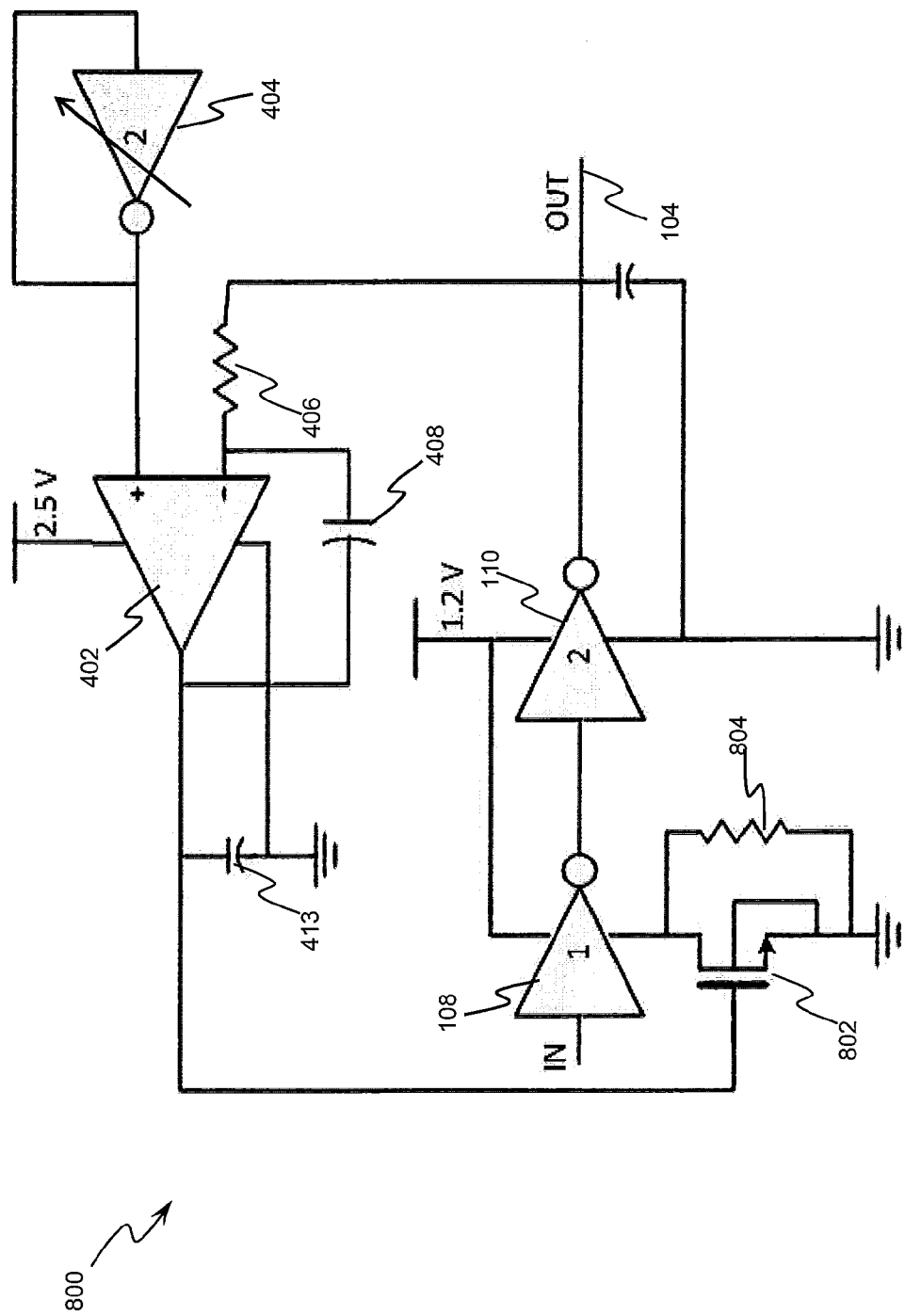
FIG. 8 is a circuit diagram of a duty cycle correction circuit according to a third embodiment.

FIG. 8 is a circuit diagram of a duty cycle correction circuit 800 according to a third embodiment. The circuit 800 is similar to the circuit 700 (and the elements in circuit 800 are denoted by the same reference numerals as the corresponding elements in circuit 700 described above). However, the circuit 800 does not include the AC coupling capacitor 106, and the feedback signal is provided to the gate of a transistor 802, rather than being provided to the data input of the first inverter 108. The circuit 800 does not include the switches 412 and 414, so the feedback circuitry cannot be switched off in the circuit 800. In other embodiments, the circuit 800 could have switches 412 and 414 for use in switching off the feedback circuitry. The circuit 800 also comprises a resistor 804. The resistor 804 and the transistor 802 are connected in parallel between the ground supply terminal of the first inverter 108 and the ground supply voltage.

By changing the feedback signal provided to the gate of the transistor 802 the resistance between the first inverter 108 and the ground supply voltage can be varied. Changing the resistance between the first inverter 108 and the ground supply voltage will change the slew rate of the falling edges of the signal output from the first inverter 108. As described above, and as can be seen from FIGS. 6a and 6b, changing the slew rate of the signal output from the first inverter 108 will affect the duty cycle of the output signal. For example, increasing the feedback signal provided to the gate of transistor 802 will reduce the resistance between the first inverter 108 and the ground supply voltage. This will increase the slew rate of the falling edges of the signal output from the first inverter 108 such that the signal output from the first inverter 108 is higher than the DC operating point of the second inverter 110 for a shorter amount of time. In contrast, decreasing the feedback signal provided to the gate of transistor 802 will increase the resistance between the first inverter 108 and the ground supply voltage. This will decrease the slew rate of the falling edges of the signal output from the first inverter 108 such that the signal output from the first inverter 108 is higher than the DC operating point of the second inverter 110 for a longer amount of time. It can therefore be seen that controlling the slew rate of the first inverter 108 using the feedback signal will in turn control the duty cycle of the output signal.

The circuit 800 does not include the AC coupling capacitor 106 of circuits 400 and 700. This may provide advantages for low frequency oscillating input signals (which may be blocked or partially blocked by the AC coupling capacitor 106 in circuits 400 and 700). Circuits 400 and 700 use the AC coupling capacitor 106 so that the DC voltage of the input signal provided to the first inverter 108 can be varied independently of the DC bias voltage of the input signal to thereby provide the adjustment of the duty cycle as described above. However, in the circuit 800, the feedback signal does not affect the input signal to the first inverter 108 and as such an AC coupling capacitor is not required in the circuit 800. The adjustment of the duty cycle is provided by controlling the resistance between the first inverter 108 and the ground voltage supply.

However, the circuit 800 has a limited range over which the duty cycle can be corrected. Adjusting the slew rate of falling edges of the first inverter 108 is usually not as effective as adjusting the DC bias of the input signal to the first inverter 108 at correcting the duty cycle of the input signal. The phase noise degradation of the input signal is worse when using the circuit 800 as compared to the circuits 400 or 700, due to a higher effective resistance when t1H>t1L in circuit 800. If the shunt resistor 804 is not used, the phase noise degradation of the input signal will be even worse, since the transistor 802 would then operate in the saturation region during transitions in the inverter 108. To avoid, or reduce this effect, the shunt resistor 804 is used to limit the maximum resistance between the first inverter 108 and the ground supply voltage.

Figure 9:
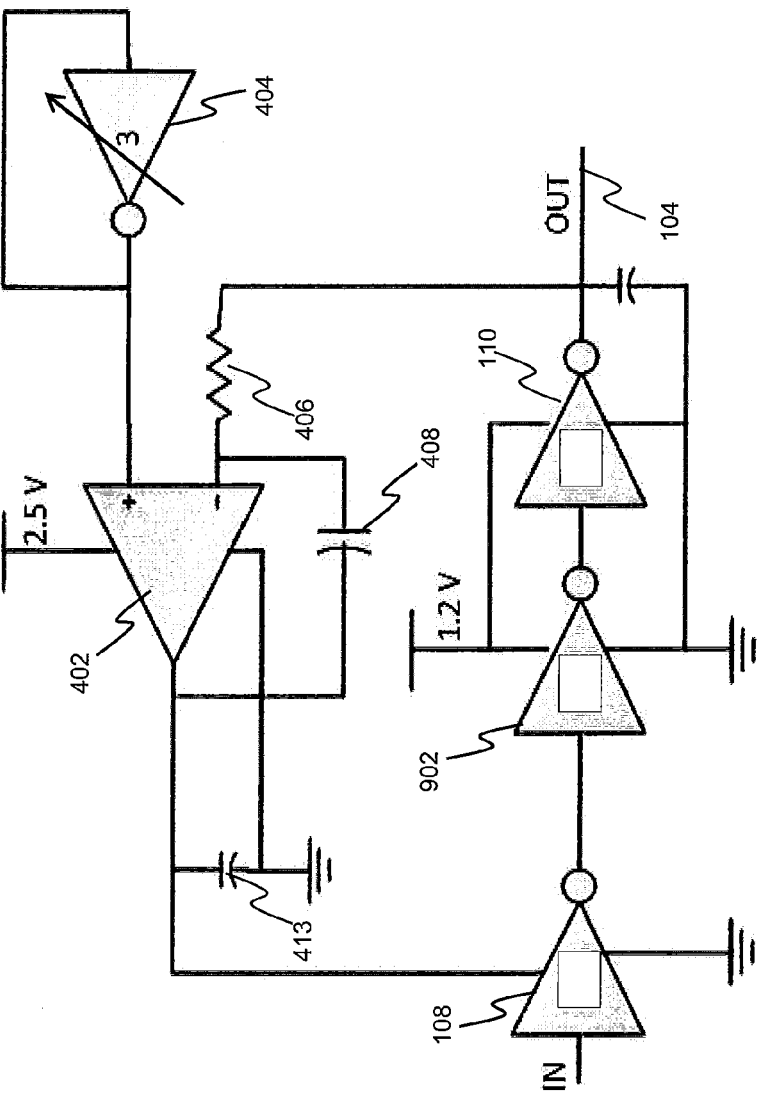
FIG. 9 is a circuit diagram of a duty cycle correction circuit according to a fourth embodiment.

FIG. 9 is a circuit diagram of a duty cycle correction circuit 900 according to a fourth embodiment. The circuit 900 is the same as the circuit 800 (and the elements in circuit 900 are denoted by the same reference numerals as the corresponding elements in circuit 800 described above) except that circuit 900 does not include the transistor 802 or the resistor 804 and the circuit 900 includes a third inverter 902 positioned between the first inverter 108 and the second inverter 110 in the sequence of inverters. The third inverter 902 is present in the circuit 900 in order to ensure that the feedback circuit provides negative feedback. Without the third inverter 902, the feedback circuit would provide positive feedback which would result in the circuit 900 not being stable. In circuit 900 the feedback signal is used to supply the supply voltage to the first inverter 108. The duty cycle of the output signal can be controlled by controlling the supply voltage of the first inverter 108 using the feedback signal. This works using the same principle as circuit 800 described above. Adjusting the feedback signal provided as the supply voltage to the first inverter 108 will change the slew rate of the rising edges of the signal output from the first inverter 108. As described above, changing the slew rate of the signal output from the first inverter 108 will affect the duty cycle of the output signal.

The circuit 900 does not include the AC coupling capacitor 106 of circuits 400 and 700. This may provide advantages for low frequency oscillating input signals (which may be blocked or partially blocked by the AC coupling capacitor 106 in circuits 400 and 700). The adjustment of the duty cycle is provided by controlling the supply voltage to the first inverter 108.

However, the circuit 900 has a limited range over which the duty cycle can be corrected. Adjusting the slew rate of rising edges of the first inverter 108 is usually not as effective as adjusting the DC bias of the input signal to the first inverter 108 at correcting the duty cycle of the input signal. The noise generated by the circuit 900 is greater than the noise generated by circuits 400 and 700 because of the third inverter 902 in the signal chain. Extra circuitry on signal chain adds noise. Furthermore, the circuit 900 may require high voltage devices for inverters which have lower transconductance with the same current, hence higher noise contribution.

With the circuit 900, the current driving capability of the integrator 402 needs to be higher than the Root Mean Squared (RMS) current consumption of the first inverter 108 so that the integrator 402 can provide sufficient current for the first inverter 108 to function correctly. This leads to a high current consumption of the circuit 900 compared to the other circuits described herein.

Figure 10:
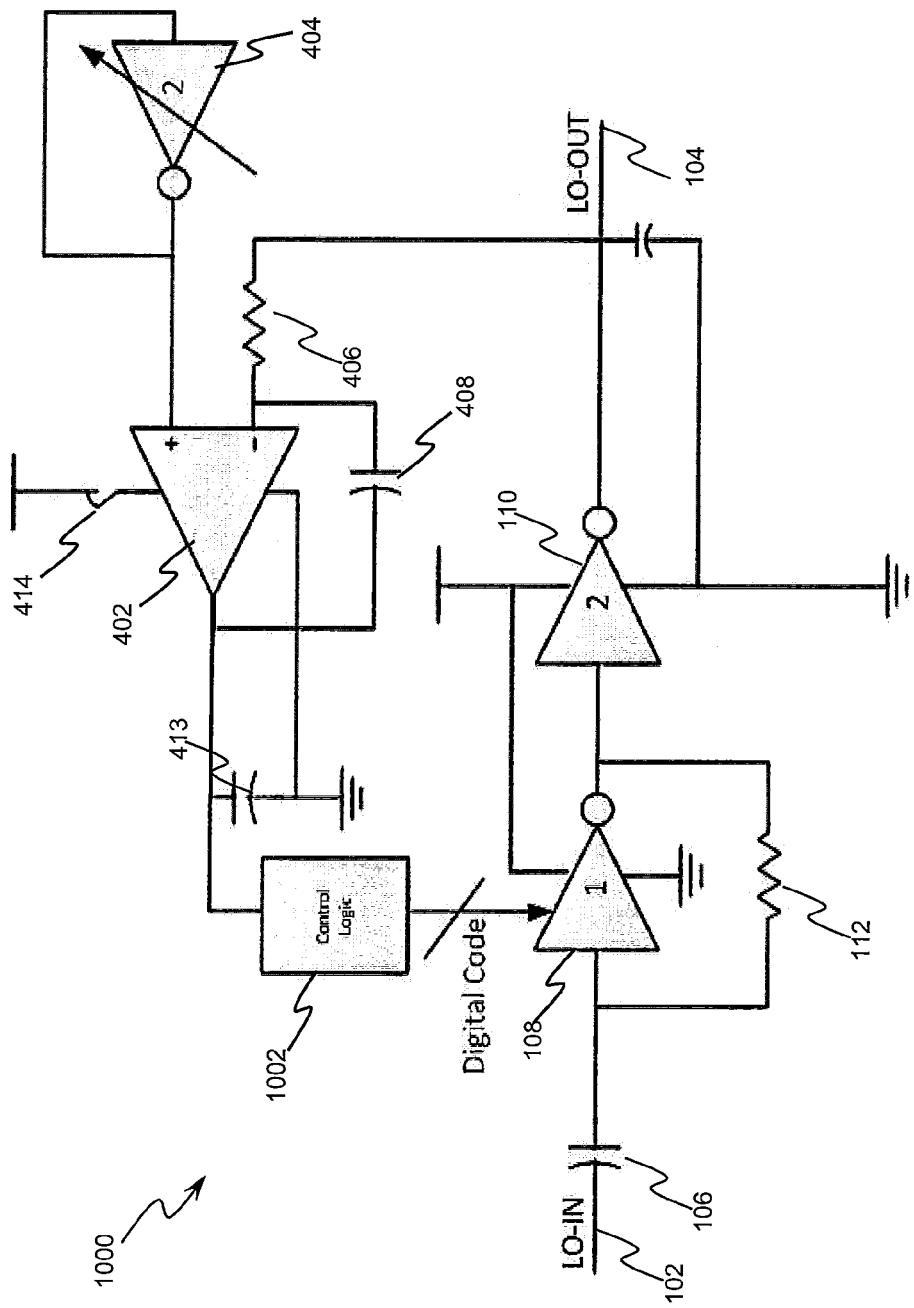
FIG. 10 is a circuit diagram of a duty cycle correction circuit according to a fifth embodiment.

FIG. 10 is a circuit diagram of a duty cycle correction circuit 1000 according to a fifth embodiment. The circuit 1000 is similar to the circuit 400 (and the elements in circuit 1000 are denoted by the same reference numerals as the corresponding elements in circuit 400 described above). However, instead of supplying the feedback signal to the data input of the first inverter 108, the circuit 1000 includes a control logic block 1002 which provides a feedback signal to the first inverter 108. The control logic block 1002 includes instructions (as digital code) in the feedback signal for adjusting the properties of at least one transistor within the first inverter 108 to thereby adjust the operating conditions of the first inverter 108. For example, the size of the transistors in the first inverter 108 can be controlled using the digital code in the feedback signal. In this way, the duty cycle of the output signal can be controlled because changing the size of the transistors of the first inverter 108 will change the slew rate of the edges of the signal output from the first inverter 108, similar to the circuits 800 or 900.

However, if the duty cycle needs to be corrected continuously, there will be switching noise and transients at the output of the first inverter 108 as the properties of the transistors within the first inverter 108 are changed, which is not desired. Furthermore, the circuit 1000 has limited resolution and accuracy in correcting the duty cycle of the input signal as compared to the circuits 400, 700, 800 and 900.

It can therefore be seen that the feedback circuitry including the integrator 402 which compares the output signal to a reference signal can be used in many different embodiments (e.g., in circuits 400, 700, 800, 900 or 1000) to control the operating conditions of the first inverter 108 to thereby bring the duty cycle of the output signal towards a desired value.

Figure 11:
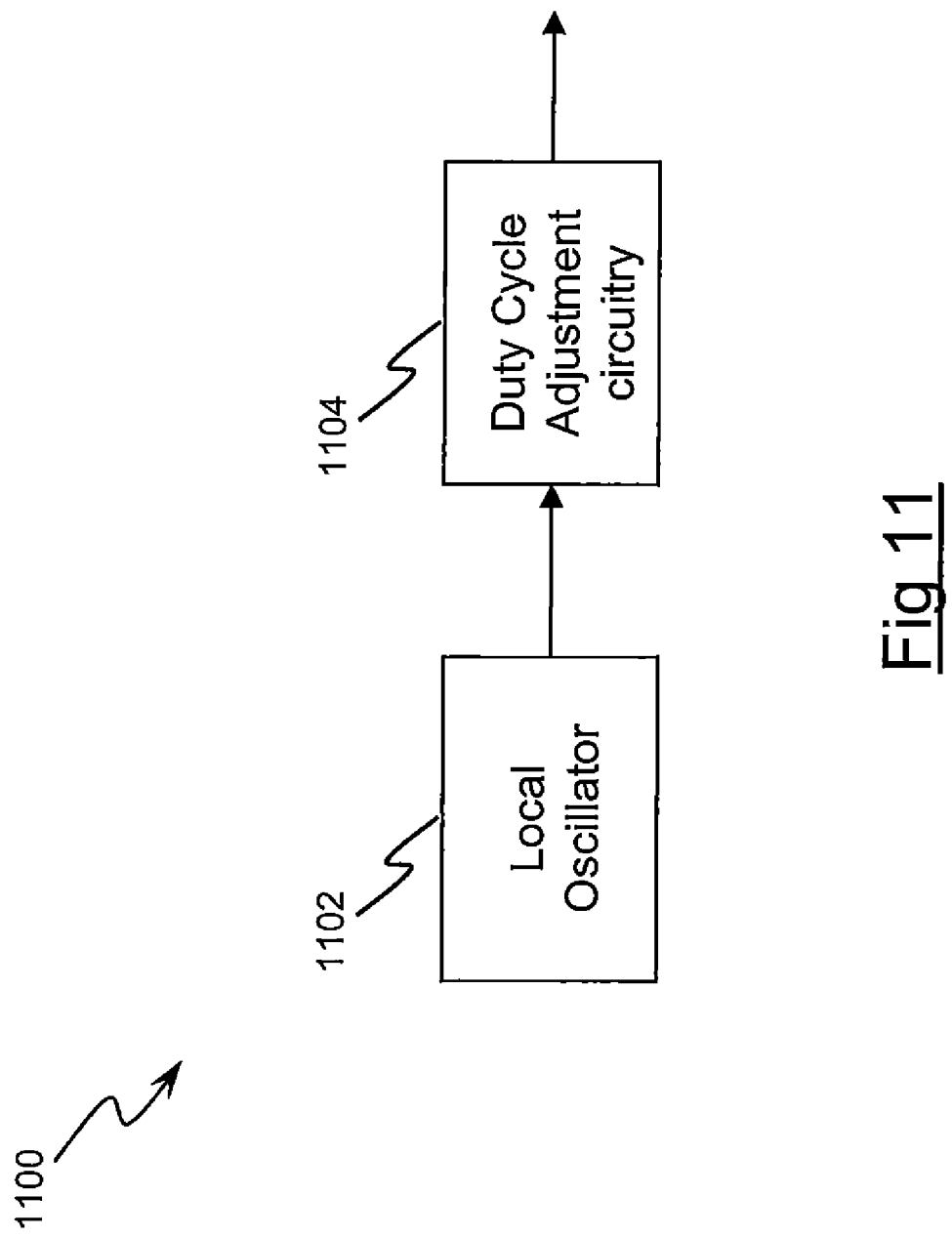
FIG. 11 is a schematic diagram of a system for controlling the duty cycle of a local oscillator signal according to an embodiment.

FIG. 11 shows a system 1100 which includes a local oscillator 1102 and duty cycle adjustment circuitry 1104. The local oscillator 1102 is arranged to generate and output an oscillating signal, such as a clock signal. The oscillating signal passes to the duty cycle adjustment circuitry 1104. The duty cycle adjustment circuitry 1104 is implemented according to the description above, e.g., as circuit 400, 700, 800, 900 or 1000. The duty cycle adjustment circuitry 1104 adjusts the duty cycle of the signal generated by the local oscillator 1102. The signal output from the duty cycle adjustment circuitry 1104 can be passed to other elements in the system 1100. For example, the duty cycle adjustment circuitry 1104 may bring the duty cycle of the signal generated by the local oscillator 1102 towards 50%, this is particularly useful if the oscillating signal generated by the local oscillator is to be used as a clock signal in the system 1100.

By varying the reference signal in the duty cycle adjustment circuitry 1104 the duty cycle of the signal output from the duty cycle adjustment circuitry 1104 can be controlled towards desired values other than 50%.

The circuits 400, 700, 800, 900 and 1000 use different methods to control the operating conditions of the first inverter 108. In other embodiments, the methods of any of the circuits 400, 700, 800, 900 and 1000 may be used in combination with each other. For example, one or more feedback signals may be used to control any combination of: (i) the DC value of the input signal received at the first inverter 108, (ii) the resistance between the first inverter 108 and the ground voltage supply, (iii) the voltage supplied to the supply voltage terminal of the first inverter 108, and (iv) the properties of the transistors within the first inverter 108.

Although the embodiments described above include two inverters 108 and 110 (and a third inverter 902 in circuit 900) the sequence of inverters may include any number of inverters (greater than or equal to two), as long as loop stability can be established. The circuits 400, 700, 800 and 1000 use an even number of inverters, but the circuit 900 requires an odd number of inverters as described above. There may also be an upper limit for the number of inverters as the feedback loop may become unstable above some number of inverters due to the delay in the signal chain caused by the inverters. Furthermore, although in the embodiments described above, it is the operating conditions of the first inverter 108 in the sequence of inverters which are controlled by the feedback signal, in other embodiments, the operating conditions of other ones of the inverters in the sequence of inverters may be controlled using the feedback signal, in addition or as an alternative to controlling the operating conditions of the first inverter 108.

While this invention has been particularly shown and described with reference to preferred embodiments, it will be understood to those skilled in the art that various changes in form and detail may be made without departing from the scope of the invention as defined by the appendant claims.

The invention claimed is:

1. Circuitry for controlling the duty cycle of an input signal towards a desired value, the circuitry comprising:
   a sequence of at least two inverters arranged in series, wherein a first inverter of the sequence of inverters is arranged to receive the input signal and wherein a last inverter of the sequence of inverters is arranged to output an output signal having a same frequency as the input signal, said output signal being an adjusted version of the input signal and wherein the output of the first inverter is coupled via a resistor to the input of the first inverter; and
   feedback circuitry arranged to receive the output signal, the feedback circuitry comprising:
   comparing means for comparing the output signal with a reference signal indicative of a desired value and for generating a feedback signal based on the comparison of the output signal and the reference signal, and
   supplying means for supplying the feedback signal to adjust operating conditions of at least one of the inverters of the sequence of inverters, such that the duty cycle of the output signal is controlled towards said desired value.

2. The circuitry of claim 1 wherein said at least one of the inverters is the first inverter.

3. The circuitry of claim 1 further comprising a coupling capacitor wherein the first inverter of the sequence of inverters is arranged to receive the input signal via the coupling capacitor.

4. The circuitry of claim 1 wherein the desired value is variable, and wherein the circuitry further comprises means for generating the reference signal, wherein the reference signal is adjustable to be indicative of the desired value.

5. The circuitry of claim 1 wherein the reference signal is a DC reference signal.

6. The circuitry of claim 5 wherein the DC reference signal is equal to the DC operating point of the last inverter of the sequence of inverters.

7. The circuitry of claim 1 wherein the feedback signal is based on an integral of the difference between the output signal and the reference signal.

8. The circuitry of claim 7 wherein the comparing means comprises an integrator which is arranged to:
receive the reference signal at a positive data input of the integrator; and
receive the output signal at a negative data input of the integrator.

9. The circuitry of claim 8 wherein the integrator is arranged to integrate the difference between the reference signal and the output signal at a frequency range which is lower than the dominant frequency of the input signal.

10. The circuitry of claim 1 further comprising switching means for either engaging or disengaging the feedback circuitry from the sequence of inverters.

11. The circuitry of claim 1 wherein the sequence of inverters comprises only two inverters, those being the first and last inverters.

12. The circuitry of claim 1 wherein the supplying means is arranged to supply the feedback signal to said at least one of the inverters to thereby adjust the switching point of said at least one of the inverters.

13. The circuitry of claim 1 wherein said at least one of the inverters is connected to a ground voltage terminal via a transistor and a resistor arranged in parallel, and wherein the supplying means is arranged to supply the feedback signal to the gate of the transistor, such that the feedback signal adjusts the resistance between said at least one of the inverters and the ground voltage terminal.

14. The circuitry of claim 1 wherein the supplying means is arranged to supply the feedback signal to a source voltage input of said at least one of the inverters, such that the feedback signal adjusts the source voltage supplied to said at least one of the inverters.

15. The circuitry of claim 1 wherein the comparing means comprises control logic for generating the feedback signal, wherein the supplying means is arranged to supply the feedback signal to said at least one of the inverters, the feedback signal comprising instructions for adjusting the properties of at least one transistor within said at least one of the inverters to thereby adjust the operating conditions of said at least one of the inverters.

16. A system for generating an oscillating signal, the system comprising:
an oscillator for generating an oscillating signal; and
circuitry for controlling the duty cycle of the oscillating signal generated by the oscillator towards a desired value, wherein the system is arranged such that the oscillating signal generated by the oscillator is input to the circuitry, the circuitry comprising:
a sequence of at least two inverters arranged in series, wherein a first inverter of the sequence of inverters is arranged to receive the input signal and wherein a last inverter of the sequence of inverters is arranged to output an output signal having a same frequency as the input signal, said output signal being an adjusted version of the input signal and wherein the output of the first inverter is coupled via a resistor to the input of the first inverter; and
feedback circuitry arranged to receive the output signal, the feedback circuitry comprising:
comparing means for comparing the output signal with a reference signal indicative of a desired value and for generating a feedback signal based on the comparison of the output signal and the reference signal, and
supplying means for supplying the feedback signal to adjust operating conditions of at least one of the inverters of the sequence of inverters, such that the duty cycle of the output signal is controlled towards said desired value.

17. A method of controlling the duty cycle of an input signal towards a desired value, the method comprising:
receiving the input signal at a first inverter of a sequence of at least two inverters arranged in series, wherein the output of the first inverter is coupled via a resistor to the input of the first inverter;
outputting an output signal having a same frequency as the input signal from a last inverter of the sequence of inverters, said output signal being an adjusted version of the input signal;
receiving the output signal at feedback circuitry;
comparing the output signal with a reference signal indicative of a desired value at the feedback circuitry, the feedback circuitry generating a feedback signal based on the comparison of the output signal and the reference signal; and
supplying the feedback signal to adjust operating conditions of at least one of the inverters of the sequence of inverters, such that the duty cycle of the output signal is controlled towards said desired value.

18. The method of claim 17 wherein said at least one of the inverters is the first inverter.

19. The method of claim 17 further comprising adjusting the reference signal.

20. The method of claim 17 wherein the feedback signal is supplied to said at least one of the inverters to adjust the switching point of said at least one of the inverters.

* * * * *